United States Patent
Honda et al.

(10) Patent No.: US 6,583,620 B2
(45) Date of Patent: Jun. 24, 2003

(54) PLANE MAGNETIC SENSOR AND PLANE MAGNETIC SENSOR FOR MULTIDIMENSIONAL MAGNETIC FIELD ANALYSIS

(75) Inventors: Shigeo Honda, Hiroshima (JP); Hideyuki Yamane, Hiroshima (JP); Yoshimi Enoki, Hiroshima (JP); Shigeki Wagata, Hiroshima (JP)

(73) Assignee: Delta Tooling Co., Ltd., Hiroshima (JP)

( * ) Notice: Subject to any disclaimer, the term of this patent is extended or adjusted under 35 U.S.C. 154(b) by 0 days.

(21) Appl. No.: 09/902,947

(22) Filed: Jul. 11, 2001

(65) Prior Publication Data

US 2002/0030490 A1 Mar. 14, 2002

(30) Foreign Application Priority Data

Jul. 21, 2000 (JP) .................................. 2000-220132

(51) Int. Cl.[7] ........................ G01R 33/02; H01L 43/08
(52) U.S. Cl. .................... 324/252; 338/32 R; 428/692
(58) Field of Search ............................... 324/252, 249, 324/235; 338/32 R; 428/692

(56) References Cited

U.S. PATENT DOCUMENTS 6,121,852 A  *  9/2000  Mizoguchi et al. ......... 336/200
6,291,993 B1 *  9/2001  Fert et al. .................. 324/252

* cited by examiner

Primary Examiner—Walter E. Snow
(74) Attorney, Agent, or Firm—Steinberg & Raskin, P.C.

(57) ABSTRACT

A plane magnetic sensor or a plane magnetic sensor for a multidimensional magnetic field analysis which can measure a magnetic field ever a wide area in a short time is provided. A plane magnetic sensor 10 according to the present invention comprises a sensing layer 11 made of a magnetoresistance effect film formed in a planar state with an arbitrary size, to pass a current therethrough due to a tunneling effect only when voltage reaches or exceeds a predetermined value, and to change its resistance value to show a giant magnetoresistance effect when directions of magnetization of magnetic fine particles change according to the strength of a magnetic field, and conductor layers 12, 13 laminated on respective surfaces of the magnetoresistance effect film and are made of a plurality of line conductor films 12a, 13a formed in linear shapes along directions of the respective surfaces with predetermined intervals therebetween. The line conductor films 12a of one conductor layer 12 and the line conductor films 13a of the other conductor layer 13 are arranged to intersect to each other in plan view, with the magnetoresistance effect film therebetween.

9 Claims, 6 Drawing Sheets

PLANE MAGNETIC SENSOR AND PLANE MAGNETIC SENSOR FOR MULTIDIMENSIONAL MAGNETIC FIELD ANALYSIS

BACKGROUND OF THE INVENTION

The present invention relates to a magnetic sensor which is used in measuring a magnetic field, and, more particularly, to a plane magnetic sensor and a plane magnetic sensor for a multidimensional magnetic field analysis which suitably measure the magnetic field over a wide area.

In order to measure the magnetic field on the periphery of an object to be measured (such as a permanent magnet and electronic equipment with a magnet embedded therein), a fluxmeter, a gauss meter and the like are conventionally used, and a sensor such as a hole element is positioned to measure a predetermined measuring point on the periphery of the object to be measured and then the position is changed manually. A magnetic flux density which is measured by the gauss meter and the like is plotted by each measuring point, whereby the magnetic field on the periphery of the object to be measured is processed to be visually recognized.

However, according to the conventional method of measuring the magnetic field as described above, it is necessary to move one sensor from a predetermined measuring point to another, which is time consuming. For this reason, it is not suitable for detecting magnetic field changes on the periphery of the object to be measured in real time. Further, when the measuring point is changed manually, the positioning to the respective measuring points is difficult. Meanwhile, in order to eliminate the aforementioned disadvantages, it is possible to arrange a plurality of sensors in the same plane and to simultaneously measure the magnetic fields over a wide area. Thereby, the magnetic fields at the respective measuring points in the same plane can be measured in a short time without moving the sensor. However, since it is necessary to connect the respective sensors to lead wires for supplying driving voltage or a driving current and to lead wires for detecting an output current or output voltage, it is not practical because of the large number of the lead wires and of its complexity.

SUMMARY OF THE INVENTION

The present invention is made to overcome the above disadvantages, and it is an object of the present invention to provide a plane magnetic sensor and a plane magnetic sensor for a multidimensional magnetic field analysis which can measure magnetic fields of a plurality of measuring points in, a very short time, has a small number of lead wires, and is suitable for the practical use.

In accordance with one aspect of the present invention, a plane magnetic sensor is provided. The plane magnetic sensor comprises a sensing layer which is composed of an arbitrary-sized plane magnetoresistance effect film, to pass a current therethrough due to a tunneling effect only when voltage reaches or exceeds a predetermined value, and to change its resistance value to show a giant magnetoresistance effect when directions of magnetization of magnetic particles change according to the strength of a magnetic field, and conductor layers which are laminated on respective surfaces of the magnetoresistance effect film and are composed of a plurality of line conductor films formed in linear shapes along directions of the respective surfaces with predetermined intervals therebetween. Further, the line conductor films of one conductor layer and the line conductor films of the other conductor layer are arranged to intersect to each other in plan view, with the magnetoresistance effect film therebetween.

In a preferred embodiment of the present invention, adjacent films of the line conductor films to compose the conductor layers are not connected to each other but are arranged independently.

In a preferred embodiment of the present invention, the magnetoresistance effect film to compose the sensing layer is a granular film made from an insulating oxide containing metal fine particles of magnetic material.

In accordance with another aspect of the present invention, a plane magnetic sensor for a multidimensional magnetic field analysis is provided. The plane magnetic sensor for the multidimensional magnetic field analysis comprises a plane magnetic sensor comprising a sensing layer composed of an arbitrary-sized plane magnetoresistance effect film, to pass a current therethrough due to a tunneling effect only when voltage reaches or exceeds a predetermined value, and to change its resistance value to show a giant magnetoresistance effect when directions of magnetization of magnetic particles change according to the strength of a magnetic field, and conductor layers which are laminated on respective surfaces of the magnetoresistance effect film and are composed of a plurality of line conductor films formed in linear shapes along directions of the respective surfaces with predetermined intervals therebetween, wherein the line conductor films of one conductor layer and the line conductor films of the other conductor layer are arranged to intersect to each other in plan view, with the magnetoresistance effect film therebetween, and at least one other plane magnetic sensor including a sensing layer which is composed of an arbitrary-sized plane magnetoresistance effect film having a magnetic anisotropy, and conductor layers which are laminated on the respective surfaces of the sensing layer and are formed by a plurality of line conductor films formed in linear shapes along directions of the respective surfaces with predetermined intervals therebetween, with the line conductor films of one conductor layer and the line conductor films of the other conductor layer being arranged to intersect to each other in plan view with the magnetoresistance effect film therebetween. Further, the plane magnetic sensors are laminated via an insulation member so that a magnetoresistance change can be detected multidirectionally.

In a preferred embodiment of the present invention, adjacent films of the line conductor films to compose the conductor layers are not connected to each other but are arranged independently.

In a preferred embodiment of the present invention, the magnetoresistance effect film to compose the sensing layer is a granular film made from an insulating oxide containing metal fine particles of magnetic material.

In accordance with still another aspect of the present invention, a plane magnetic sensor is provided. The plane magnetic sensor comprises a plurality of sensing layers which are composed of arbitrary-sized plane magnetoresistance effect films, to pass a current therethrough due to a tunneling effect only when voltage reaches or exceeds a predetermined value, and to change its resistance value to show a giant magnetoresistance effect when directions of magnetization of magnetic particles change according to the strength of a magnetic field, and a plurality of conductor layers which are, laminated between magnetoresistance effect films to compose the sensing layers and on outer surfaces of the magnetoresistance effect films to compose the sensing layers arranged outside, and are composed of a plurality of line conductor films formed in linear shapes along directions of respective surfaces with predetermined intervals therebetween. Further, the line conductor films to compose the conductor layers are arranged to intersect to each other in plan view, with the magnetoresistance effect film therebetween.

In a preferred embodiment of the present invention, the adjacent films of the line conductor films to compose a pair of the conductor layers arranged outside are not connected to each other but are arranged independently, and adjacent films of the line conductor films to compose a pair of the conductor layers arranged inside are connected to each other and are arranged integrally, and intersections of the line conductor films to compose the pair of the conductor layers arranged outside and intersections of the line conductor films to compose the pair of the conductor layers arranged inside are formed to almost correspond to each other when viewed in plan.

In a preferred embodiment of the present invention, neither adjacent films of the line conductor films to compose a pair of the conductor layers arranged outside nor adjacent films of the line conductor films to compose a pair of the conductor layers arranged inside are connected to each other but are arranged independently, and intersections of the line conductor films to compose the pair of the conductor layers arranged outside and intersections of the line conductor films to compose the pair of the conductor layers arranged inside are formed to almost correspond to each other when viewed in plan.

In a preferred embodiment of the present invention, the pair of the conductor layers arranged outside are connected to a driving circuit for supplying driving voltage or a driving current, and the pair of the conductor layers arranged inside are connected to a detecting circuit for detecting output voltage or an output current.

In a preferred embodiment of the present invention, the magnetoresistance effect film to compose the sensing layer is a granular film made from an insulating oxide containing metal fine particles as magnetic material.

In accordance with yet another aspect of the present invention, a plane magnetic sensor for a multidimensional magnetic field analysis is provided. The plane magnetic sensor for the multidimensional magnetic field analysis comprises a plane magnetic sensor comprising a plurality of sensing layers composed of arbitrary-sized plane magnetoresistance effect films, to pass a current therethrough due to a tunneling effect only when voltage reaches or exceeds a predetermined value, and to change its resistance value to show a giant magnetoresistance effect when directions of magnetization of magnetic particles change according to the strength of a magnetic field, and a plurality of conductor layers which are laminated between magnetoresistance effect films to compose the sensing layers and on outer surfaces of the magnetoresistance effect films to compose the sensing layers arranged outside, and are composed of a plurality of line conductor films formed in linear shapes along directions of respective surfaces with predetermined intervals therebetween, wherein the line conductor films to compose the conductor layers are arranged to intersect to each other in plan view, with the magnetoresistance effect film therebetween, and at least one other plane magnetic sensor including a sensing layer which is composed of an arbitrary-sized plane magnetoresistance effect film having a magmagnetic anisotropy, and conductor layers which are laminated on the respective surfaces of the sensing layer and are formed by a plurality of line conductor films formed in linear shapes along directions of the respective surfaces with predetermined intervals therebetween, with the line conductor films of one conductor layer and the line conductor films of the other conductor layer being arranged to intersect to each other in plan view with the magnetoresistance effect film therebetween. Further, the plane magnetic sensors are laminated via an insulation member so that a magnetoresistance change can be detected multidirectionally.

DETAILED DESCRIPTION OF THE PREFERRED EMBODIMENTS

Figure 1:
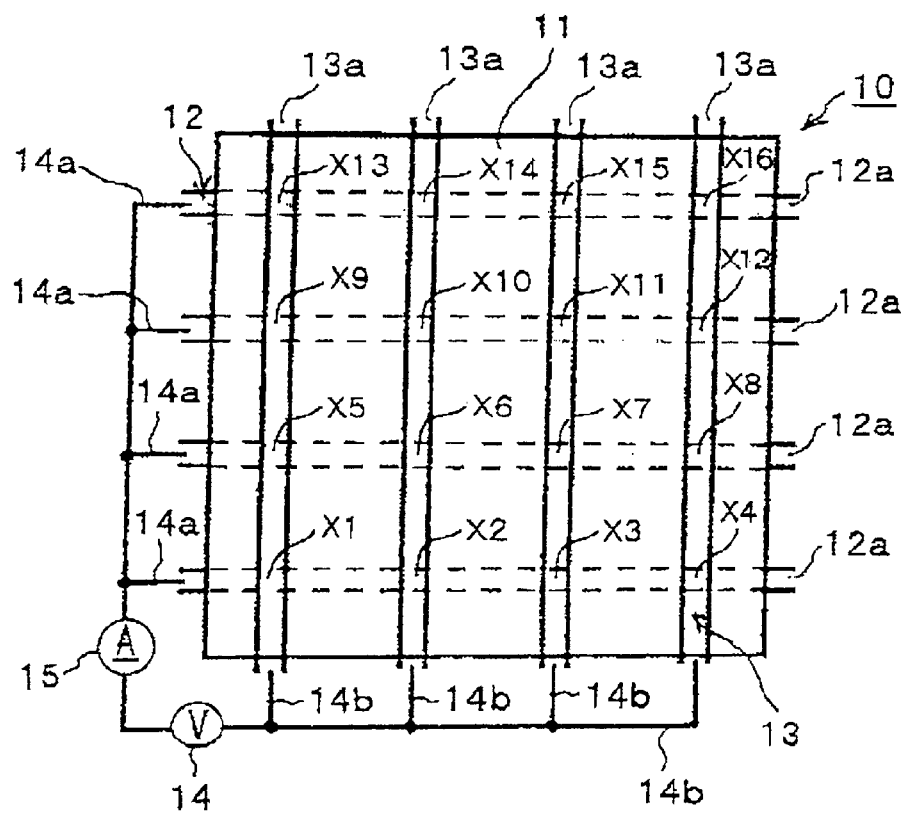
FIG. 1 is a plane view showing a first embodiment of a plane magnetic sensor according to the present invention.
Figure 2:
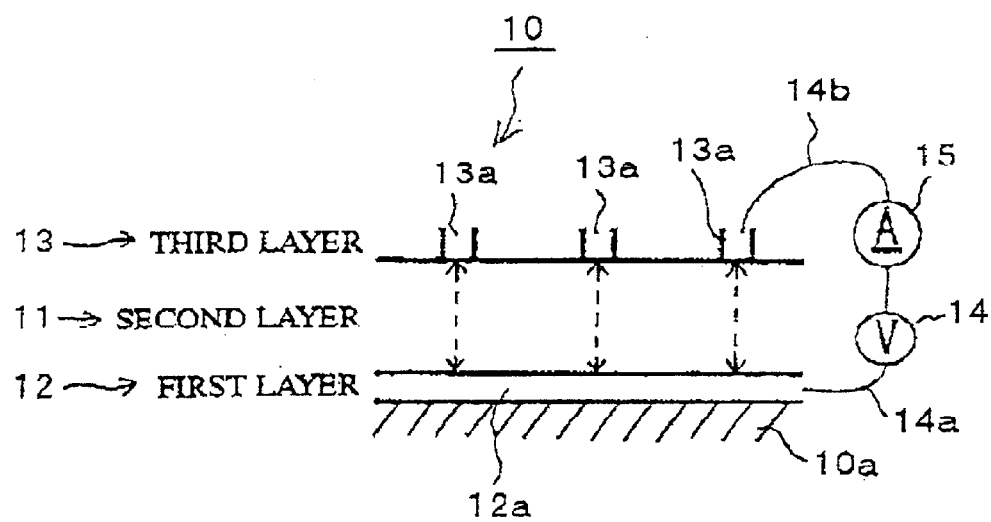
FIG. 2 is a partial sectional view of the above-mentioned embodiment.

Hereinafter, the present invention will be described in detail based on the embodiments shown in the drawings. In FIG. 1 and FIG. 2, a plane magnetic sensor 10 according to a first embodiment of the present invention is shown. The plane magnetic sensor 10 includes a conductor layer 12, a sensing layer 11 and another conductor layer 13 which are laminated on a glass substrate 10a in the order presented.

The sensing layer 11 is composed of an arbitrary-sized magnetoresistance effect film formed in a planar state. This magnetoresistance effect film shows a giant magnetoresistance effect (GMR effect) whose maximum magnetoresistance change rate (maximum MR ratio) is several tens percent. The strength of a magnetic field varies from one measuring point to another. Hence, when the magnetoresistance effect film is formed in the planar state to simultaneously detect the magnetic fields over a wide area, it is necessary to prepare a magnetoresistance effect film showing the giant magnetoresistance effect with the large maximum MR ratio.

In order to reduce the number of lead wires, linear-shaped conductor layers 12, 13 are used in the present invention, as will be described later. Among the magnetoresistance effect films showing the giant magnetoresistance effect, a magnetoresistance effect film which shows a tunneling effect, that is, a magnetoresistance effect film having a granular film structure is used in order to limit conduction range. The tunneling effect means that a current passes only when a voltage reaches or exceeds a predetermined value.

Figure 3A:
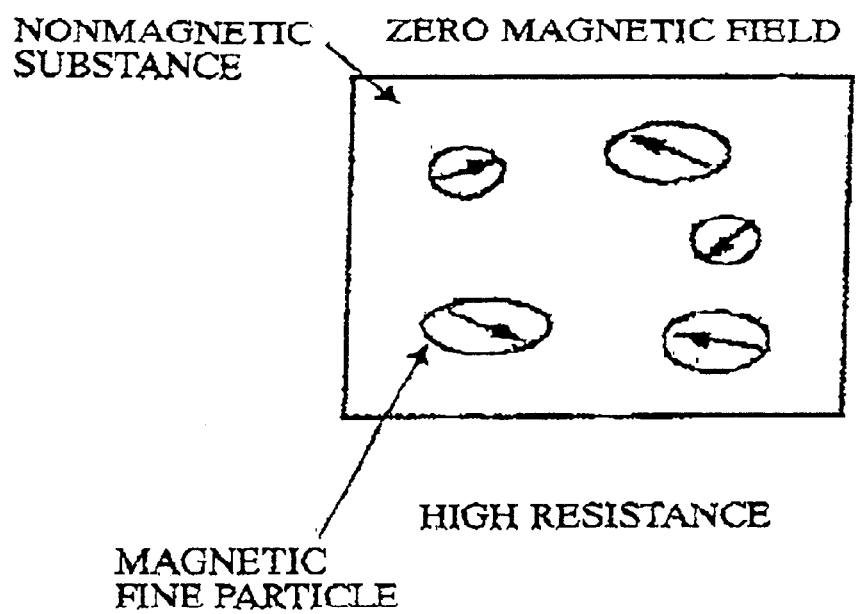
FIG. 3A and FIG. 3B arm views for explaining a characteristic of a granular film to make a sensing layer of the above-mentioned embodiment.
Figure 3B:
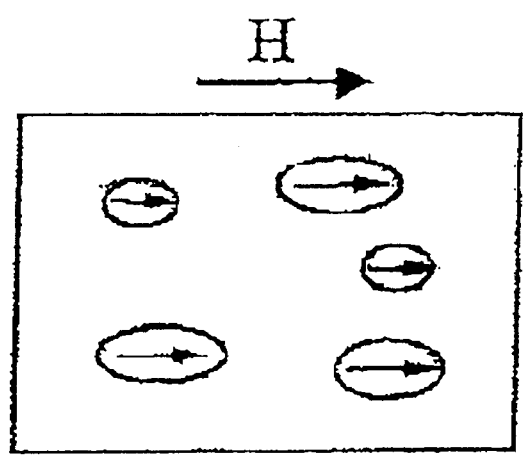
Figure 4:
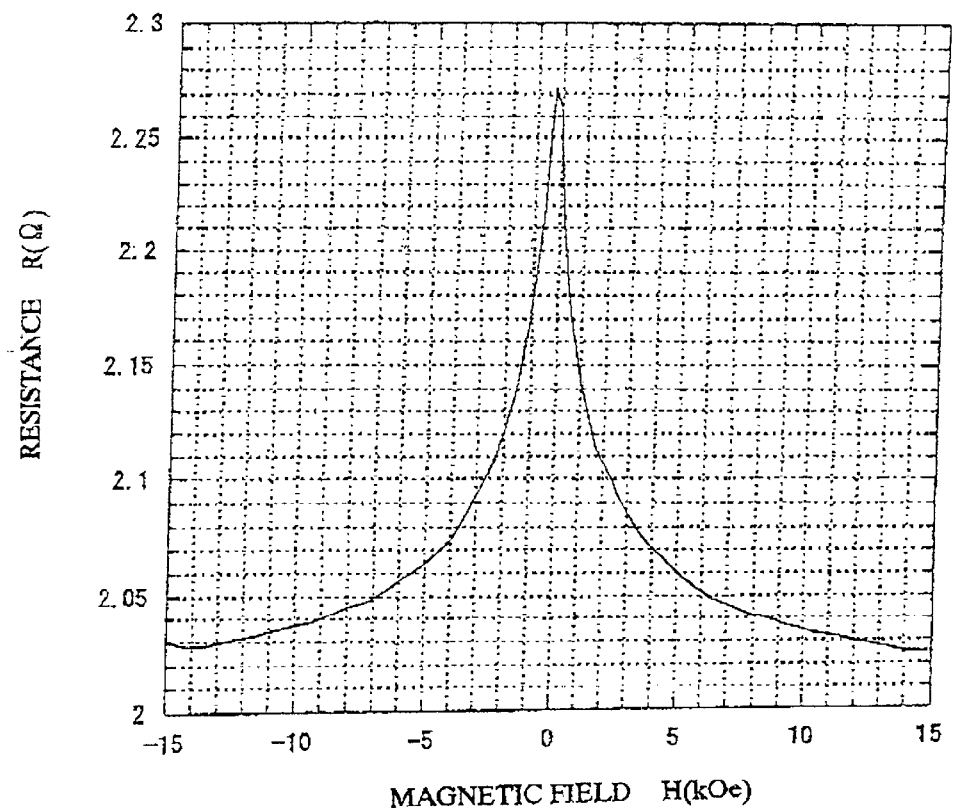
FIG. 4 is a graph showing a relationship of the strength of a magnetic field and a resistance value of the granular film to make the sensing layer of the above-mentioned embodiment.
Figure 5:
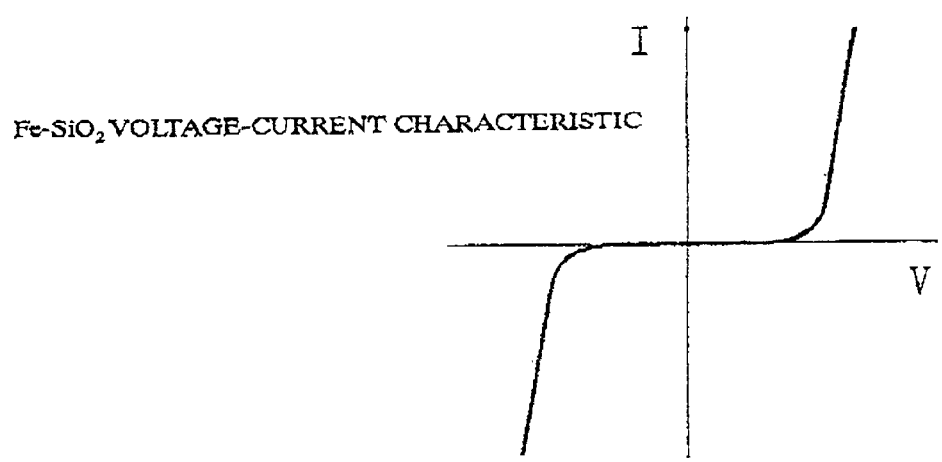
FIG. 5 is a graph showing a voltage-current characteristic of a granular film made of $Fe-SiO_2$.

The magnetoresistance effect film having the granular film structure is made from an insulating oxide which is a nonmagnetic substance, such as $SiO_2$, ZnO, ZrO, $Al_2O_3$, MgO, containing metal fine particles which are magnetic material such as Fe, Co, Fe—Co. As shown in FIG. 3A, FIG. 3B and FIG. 4, it has a characteristic that magnetization of the metal fine particles (magnetic fine particles) is oriented at random and is of high resistance in a zero magnetic field. Meanwhile, it has a characteristic that magnetization of the magnetic fine particles is oriented in the same manner and is of low resistance, by applying the magnetic field thereto. Incidentally, FIG. 5 is a graph showing a voltage-current characteristic of a granular film of Fe—$SiO_2$ which is made of silicon dioxide ($SiO_2$) containing iron (Fe) fine particles. As is clear from the drawing, the granular film of Fe—$SiO_2$ has the tunneling effect and hence the current passes therethrough only when the voltage reaches or exceeds the predetermined value.

The conductor layers 12, 13 are laminated on the respective surfaces of the sensing layer 11 which is formed in the planar state with a predetermined size. The conductor layers 12, 13 are made of a conductive material such as copper, and are structured by a plurality of line conductor films 12a, 13a which are formed in linear shapes. The adjacent line conductor films 12a and 12a or the adjacent line conductor films 13a and 13a are not connected to each other but are arranged independently with predetermined intervals therebetween, and are adhered on the respective surfaces of the sensing layer 11. More specifically, the line conductor films 12a which make the conductor layer 12 are disposed almost parallel to each other along a direction, with the intervals between the adjacent line conductor films 12a. Further, the line conductor films 13a which make the conductor layer 13 are disposed almost parallel to each other with the intervals between the adjacent line conductor films 13a, along a direction almost orthogonal to the line conductor films 12a which form the conductor layer 12. Thereby, the line conductor films 12a which make the conductor layer 12 are arranged so as to intersect at plural points with the line conductor films 13a which make the conductor layer 13, when the plane magnetic sensor 10 is viewed in plan. In other words, these are arranged in an approximately lattice shape in plan view.

The conductor layer 12 made of the line conductor films 12a, the sensing layer 11 made of the magnetoresistance effect film, and the conductor layer 13 made of the line conductor films 13a are laminated on the glass substrate 10a by any method such as a sputtering method and a vacuum evaporating method. The line conductor films 12a, 13a which make the conductor layers 12, 13 are formed into predetermined patterns by using masks (not shown) which are formed to predetermined patterns when the spattering or the like is performed.

A driving circuit and a detecting circuit are connected between the conductor layer 12 and the conductor layer 13. As shown in FIG. 1 and FIG. 2, a constant voltage circuit 14 which supplies driving power with voltage constantly is connected as the driving circuit to the line conductor films 12a of the conductor layer 12 via a lead wire 14a, and connected to the line conductor films 13a of the conductor layer 13 via a lead wire 14b. Further, an ampere meter 15 as the detecting circuit is placed therebetween.

According to this embodiment, when predetermined driving voltage is applied by the constant voltage circuit 14, a current passes from the line conductor films 12a of the conductor layer 12 to the line conductor films 13a of the conductor layer 13 via the sensing layer 11. Since the magnetoresistance effect film of the sensing layer 11 has the tunneling effect as described above in this embodiment, the current does not pass therethrough until the voltage applied thereto reaches or exceeds the predetermined value, as shown in FIG. 5. As shown in a partial sectional view in FIG. 2, the current is easy to flow at the intersections of the line conductor films 12a of the conductor layer 12 and the line conductor films 13a of the conductor layer 13 in plan view, that is, within the shortest distance (as shown as the arrows by the broken lines), where the sensing layer 11 has the lowest electrical resistance. The current becomes hard to flow with distance from the intersections. For this reason, it is possible to detect only the current values near the intersections.

Supposing that there are intersections X1 to X16 of the line conductor films 12a and the line conductor films 13a, as shown in FIG. 1. In order to measure the magnetic field thereof, according to this embodiment, for example, a line conductor film 12a which is first from the bottom in the drawing and a line conductor film 13a which is first from the left in the drawing are switched so that the voltage is applied thereto, thereby measuring the current value at the intersection X1. Similarly, a line conductor film 12a which is second from the bottom in the drawing and the line conductor film 13a which is first from the left in the drawing are switched so that the voltage is applied thereto, thereby measuring the current value AT the intersection, X5. Further, a line conductor film 12a which is first from the top in the drawing and the line conductor film 13a which is first from the right in the drawing are switched so that the voltage is applied thereto, thereby measuring the current value at the intersection on X16.

Thus, according to this embodiment, the magnetic fields of a plurality of measuring points can be measured only by switching to change combinations of the line conductor films 12a and 13a to which the driving voltage is applied. Incidentally, the switching can be carried out by, for example, any kind of controlling means (not shown) which is connected to the constant voltage circuit 14 Especially, when the controlling moans under computer control is used, the sequence of the switching and so on can be software-controlled, whereby the plurality of the measuring points can be measured in a very short time and in real time.

As shown in FIG. 1, when the 16 intersections (X1 to X16) are measured, only eight lead wires are necessary, which are the four lead wires 14a connecting the line conductor films 12a of the conductor layer 12 and the four lead wires 14b connecting the line conductor films 13a of the conductor layer 13. Supposing that sensors are independently arranged at the 16 measuring points, the total number of tile wirings is quadrupled because it is necessary to prepare the two lead wires for each measuring point, resulting in the 32 lead wires in total. It is of course that the difference increases with the increasing number of the measuring points. Therefore, the present invention is suitable for practical use as the sensor for simultaneously measuring the magnetic fields of the plural measuring points over the predetermined area, because the number of the wirings is extremely small.

In the example shown in FIG. 1, the line conductor films 12a of the conductor layer 12 and the line conductor films 13a of the conductor layer 13 are intersected almost orthogonal to each other in the plan view. However, it is not limited to the above, and these may be arranged to intersect at an angle smaller than the right angle, for example, about 60-degree or 45-degree.

Figure 6:
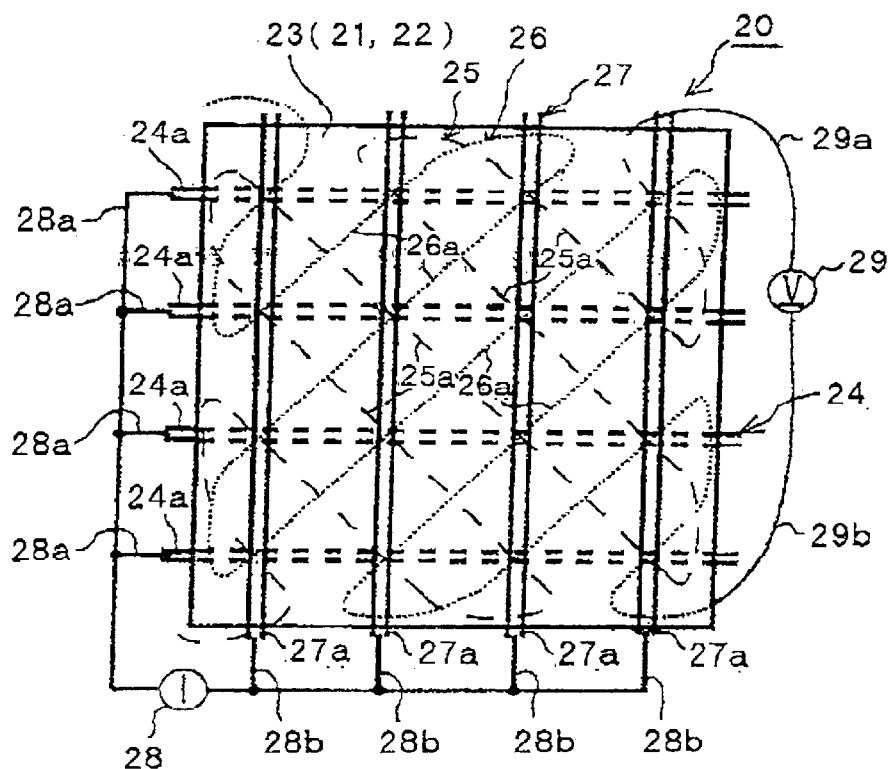
FIG. 6 is a plane, view showing a second embodiment of the plane magnetic sensor according to the present invention.
Figure 7:
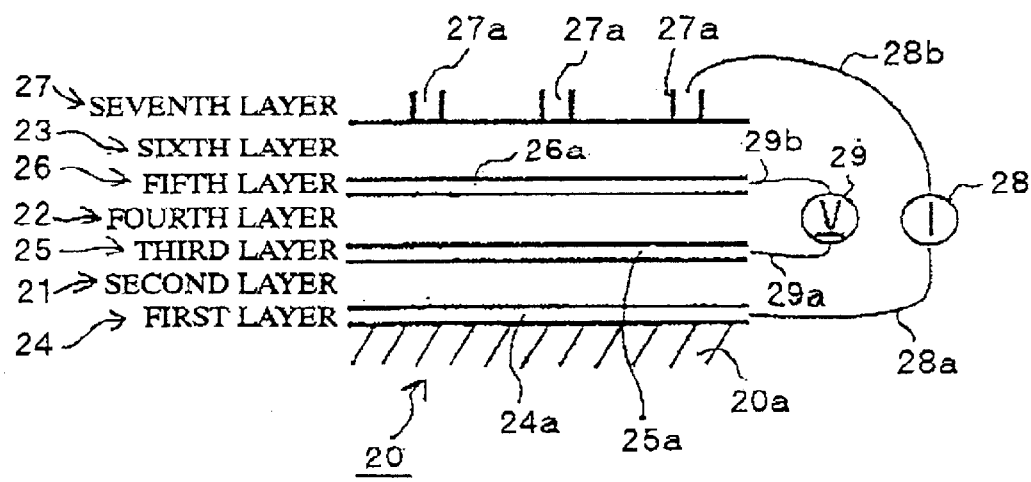
FIG. 7 is a partial sectional view of the above-mentioned embodiment.

FIG. 6 and FIG. 7 are a plane view and a partial sectional view of a plane magnetic sensor 20 according to a second embodiment of the present invention. This embodiment is different from the first embodiment in that a pair of conductor layers which are connected to a driving circuit and a pair of conductor layers which are connected to a detecting circuit arc distinguished from each other.

The plane magnetic sensor 20 according to this embodiment includes a glass substrate 20a and a laminate of seven layers in total, which are sensing layers 21 to 23, a first conductor layer 24 which is laminated between the first sensing layer 21 and the glass substrate 20a, a second conductor layer 25 which is laminated between the first sensing layer 21 and the second sensing layer 22, a third conductor layer 26 which is laminated between the second sensing, layer 22 and the third sensing layer 23, and a fourth conductor layer 27 which is laminated outside the third sensing layer 23.

The respective sensing layers 21 to 23 are made of a magnetoresistance effect film showing a giant magnetoresistance effect, which are formed in planar shapes with predetermined areas, similarly to the above-described first embodiment. Also, the respective conductor layers 24 to 27 are structured by line conductor films in linear shapes which are made of a conductive material such as copper, similarly to the first embodiment.

As to line conductor films 24a making the first conductor layer 24 which is laminated between the first sensing layer 21 and the glass substrate 20a and line conductor films 27a making the fourth conductor layer 27 which is laminated outside the third sensing layer 23, the adjacent line conductor films 24a and 24a or the adjacent line conductor films 27a and 27a are not connected to each other but are arranged independently in linear shapes. Further, the line conductor films 24a of the first conductor layer 24 and the line conductor films 27a of the fourth conductor layer 27 are arranged so as to intersect almost orthogonally in the plan view. Incidentally, this angle is not limited to a nearly right angle, similarly to the above-described first embodiment.

As to the second conductor layer 25, adjacent line conductor films 25a and 25a are connected to each other. In concrete, as shown as the broken lines in FIG. 6, the respective line conductor films 25a are arranged slantwise from one end to another, when the sensing layers 21 to 23 are viewed in plan. The line conductor films 25a are zigzagged from one side to the other side by turns, in other words, arranged to compose one integral line conductor film as a whole.

As shown as the dotted lines in FIG. 6, adjacent line conductor films 26a and 26a of the third conductor layer 26 are connected to each other and arranged to compose one integral line conductor film as a whole, similarly to the second conductor layer 25. The line conductor films 25a of the second conductor layer 25 and the line conductor films 26a of the third conductor layer 26, each of which forms one integral line conductor film as a whole, are formed to intersect with each other at an arbitrary angle, for example, at about 90-degree in plan view.

As described in the first embodiment, in the magnetoresistance effect film having the tunneling effect, the current flows at the intersections (shortest distance) of the line conductor films 25a of the second conductor layer 25 and the line conductor films 26a of the third conductor layer 26. Hence, magnetic resistance at predetermined measuring points (intersections) can be detected by being arranged as described above.

Moreover, the intersections of the line conductor films 25a of the second conductor layer 25 and the line conductor films 26a of the third conductor layer 26, which are connected to a detecting circuit, and the intersections of the line conductor films 24a of the first conductor layer 24 and the line conductor films 27a of the fourth conductor layer 27, which are connected to a driving circuit, are formed to almost correspond to each other when viewed in plan. Thus, the respective line conductor films which make the four conductor layers intersect at the same points in the plan view, which makes it possible to measure the magnetic resistance of the intersections due to the tunneling effect of the magnetoresistance effect film.

When, as shown in FIG. 6, the line conductor films 24a of the first conductor layer 24 and the line conductor films 27a of the fourth conductor layer 27 are intersected almost orthogonally, the line conductor films 25a of the second conductor layer 25 and the line conductor films 26a of the third conductor layer 26 intersect almost orthogonally to each other, and make the angle of nearly 45-dearee in the plan view to the line conductor films 24a of the first conductor layer 24 and the line conductor films 27a of the fourth conductor layer 27, whereby only the intersections of the respective conductor layers correspond to each other.

In this embodiment, as shown in FIG. 6 and FIG. 7, a constant current circuit 28 as the driving circuit which supplies driving power with a current constantly is connected to the line conductor films 24a of the first conductor layer 24 via a lead wire 28a, and connected to the line conductor films 27a of the fourth conductor layer 27 via a lead wire 28b. A volt meter 29 as the detecting circuit is connected between the line conductor films 25a of the second conductor layer 25 and the line conductor films 26a of the third conductor layer 26 via lead wires 29a, 29b. Since each of the line conductor films 25a and 26a composes one integral film as a whole, only two wirings in total are necessary for connecting the volt meter 29, each for the second conductor layer 25 and the third conductor layer 26. When there are the 16 intersections (measuring points) as shown in FIG. 6, eight lead wires, four for each of the lead wires 28a, 28b, for connecting the constant current circuit 28 are necessary. Thus, the total number of the wirings is only 10 in the embodiment.

Furthermore, according to this embodiment, when a current flows between the first conductor layer 24 and the fourth conductor layer 27, voltage values of the respective i-measuring points are measured by the volt meter 29 which is connected between the second conductor layer 25 and the third conductor layer 26. Thus, since the areas where the voltage, is measured are limited, it is less influenced by the other circuits and the measurement can be carried out with high accuracy. Incidentally, the passage of current to any of the measuring points can be controlled by the switching of controlling means which is not shown, which is similar to the above-described first embodiment.

Figure 8:
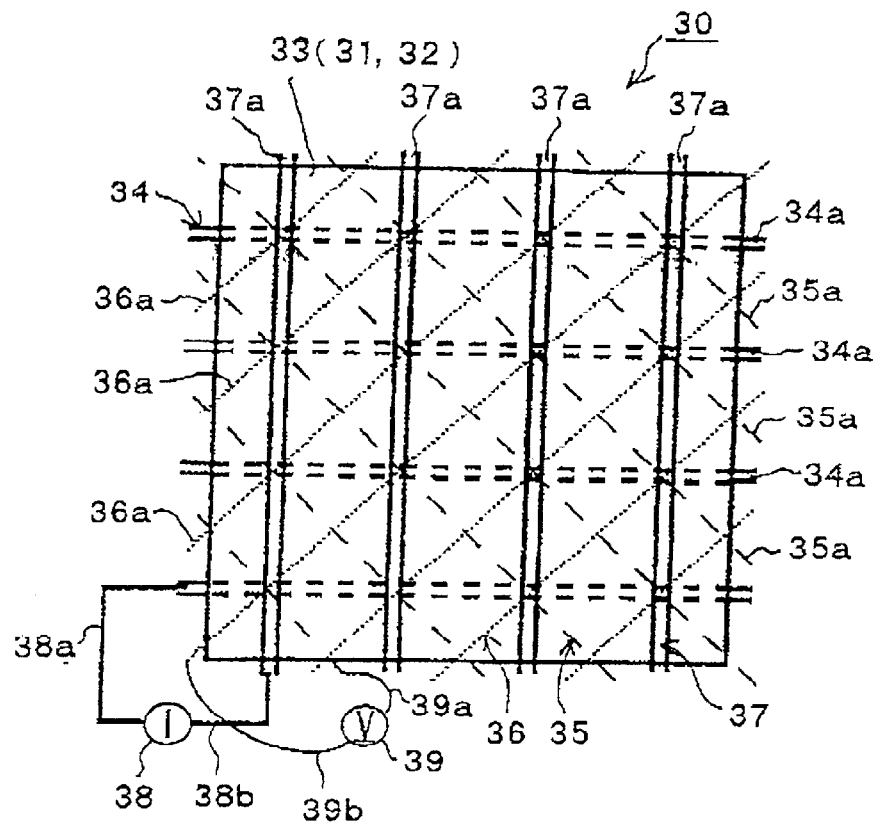
FIG. 8 is a plane view showing a third embodiment of the plane magnetic sensor according to the present invention.
Figure 9:
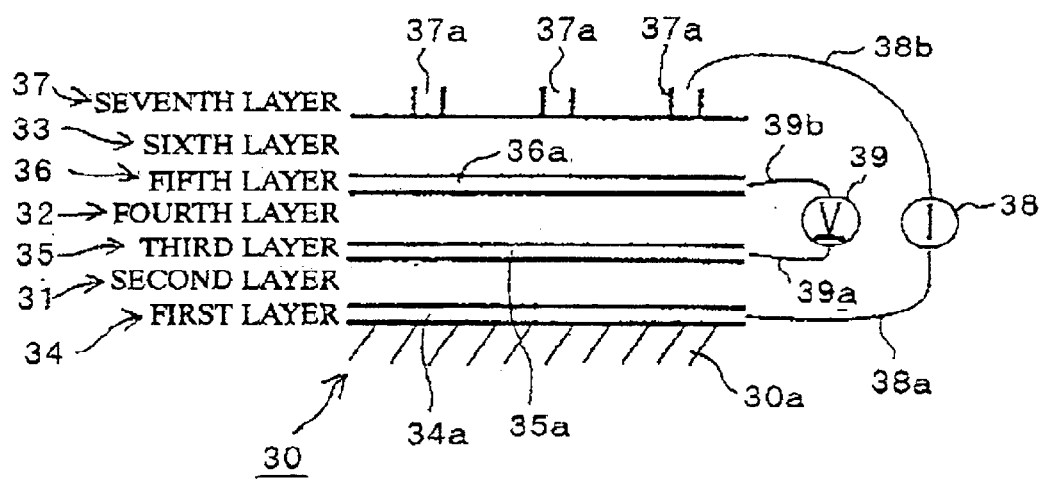
FIG. 9 is a partial sectional view of the above-mentioned embodiment.

FIG. 8 and FIG. 9 are a plane view and a partial sectional view for explaining the structure, of a plane magnetic sensor 30 according to a third embodiment of the present invention. Similarly to the second embodiment, the plane magnetic sensor 30 according to this embodiment includes a glass substrate 30a and a laminate of seven layers in total, which are three sensing layers 31 to 33, a first conductor layer 34 which is laminated between the first sensing layer 31 and the glass substrate 30a, a second conductor layer 35 which is laminated between the first sensing layer 31 and the second sensing layer 32, a third conductor layer 36 which is laminated between the second sensing layer 32 and the third sensing layer 33, and a fourth conductor layer 37 which is laminated outside the third sensing layer 33.

The respective sensing layers 31 to 33 are made of a magnetoresistance effect film showing a giant magnetoresistance effect and are formed in planar shapes with predetermined areas, similarly to the above-mentioned second embodiment. Further, the respective conductor layers 34 to 37 are structured by a plurality of line conductor films which are made of a conductive material such as copper, similarly to the second embodiment. Furthermore, line conductor films 34a which make the first conductor layer 34 and line conductor films 37a which make the fourth conductor layer 37 are arranged similarly to the second embodiment.

It should be noted that arrangements of line conductor films 35a which make the second conductor layer 35 and line conductor films 36a which make the third conductor layer 36 are different from those in the second embodiment. In the second embodiment, the line conductor films 25a of the second conductor layer 25 and the line conductor films 26a of the third conductor layer 26 are respectively arranged to form one integral line conductor film as a whole, but in this third embodiment, the adjacent line conductor films 35a and 35a or the adjacent line conductor films 36a and 36a are not connected to each other but are arranged independently.

More specifically, as shown as the broken lines in FIG. 8, a direction of the arrangement of the line conductor films 35a of the second conductor layer 35 is tilted at about 45-degree to a direction of the arrangement of the line conductor films; 34a of the first conductor layer 34, with the first sensing layer 34 therebetween. Further, as shown as the dotted lines in FIG. 3, a direction of the arrangement of the line conductor films 36a of the third conductor layer 36 is almost orthogonal to the direction of the arrangement of the line conductor films 35a of the second conductor layer 35, and a direction of the arrangement of the line conductor films 37a of the fourth conductor layer 37 is almost orthogonal to the direction of the arrangement of the line conductor films 34a of the first conductor layer 34. Moreover, intersection of the line conductor films 34a of the first conductor layer 34 and the line conductor films 37a of the fourth conductor layer 37, which are connected to a driving circuit, and intersections of the line conductor films 35a of the second conductor layer 35 and the line conductor films 36a of the third conductor layer 36, which are connected to a detecting circuit, are formed to almost correspond to each other in the plan view.

Therefore, when a current is passed at the intersections of the line conductor films 34a of the first conductor layer 34 and the line conductor films 37a of the fourth conductor layer 37 by, for example, a constant current circuit 38 as the driving circuit, voltage of the intersections of the line conductor films 35a of the second conductor layer 35 and the line conductor films 36a of the third conductor layer 36 can be measured by a volt meter 39. Since the areas where the voltage is measured axe limited, the measurement can be carried out with high accuracy in this embodiment, similarly to the second embodiment.

It should be noted that, in this embodiment, it is necessary to connect the constant current circuit 38 to the line conductor films 34a of the first conductor layer 34 and the line conductor films 37a of the fourth conductor layer 37, respectively via lead wires 38a and 38b, and to connect the volt meter 39 to the line conductor films 35a of the second conductor layer 35 and the line conductor films 36a of the third conductor layer 36, respectively, via lead wires 39a and 39b. For this reason, when there are the 16 measuring points as shown in FIG. 8, the 16 lead wires in total, eight for the lead wires 38a, 38b for the driving circuit, and eight for the lead wires 39a, 39b for the detecting circuit, are necessary. (Incidentally, the lead wires are partially shown in FIG. 8.) In this embodiment, the number of the lead wires increases than that of the second embodiment. Nevertheless, it is half the number of the wirings which are necessary to dispose sensors independently at the 16 measuring points. Incidentally, the passage of current can be controlled by the switching of controlling means which is not shown, which is similar to the above-described first and second embodiments.

The plane magnetic sensor of the present invention is not limited to the above-described embodiments. For example, the constant voltage operation in the first embodiment and the constant current operation in the second and the third embodiments may be reversed. Moreover, the measuring points are set at the 16 points in the respective embodiments, but it is one of the examples. The measuring points may be more or less than the 16 points as long as the sensing layer is formed in the planar state and measurement at the plural points is possible. Further, the area of the sensing layer and the intervals between the line conductor films which make the respective layers are not limited. The number of the sensing layers and the conductor layers to be laminated is not limited to the number illustrated in the respective embodiments.

This invention may provide a plane magnetic sensor for a multidimensional magnetic field analysis (not shown). In the plane magnetic sensor for the multidimensional magnetic field analysis, one or more plane magnetic sensor having a magnetic anisotropy is laminated on the above-described plane magnetic sensors 10 to 30 via an insulation member so that a magnetic field in a two-dimensional direction and in a three-dimensional direction can be detected.

A plane magnetic sensor which includes a sensing layer which is made of an arbitrary-sized plane magnetoresistance effect film having the magnetic anisotropy, and conductor layers which are laminated on the respective surfaces of the sensing layer and are formed by a plurality of line conductor films formed in linear shapes along directions of the respective surfaces with predetermined intervals therebetween, in which the line conductor films of one conductor layer and the line conductor films of the other conductor layer being arranged to intersect to each other ill the plan view with the magnetoresistance effect film therebetween, can be used as the plane magnetic sensor having the magnetic anisotropy. Namely, not the magnetoresistance effect film showing a magnetoresistance change without being dependent on the current and the direction of the magnetic field, but a perpendicular magnetized film or an intra-plane anisotropy film is used to form the sensing layer. Incidentally, the conductor layers which are made of the line conductor films can be arranged in various ways, similarly to the above-described embodiments.

When thus-structured plane magnetic sensor for the multidimensional magnetic field analysis is used, the magnetic fields of the plural measuring points in the two-dimensional direction and in the three-dimensional direction can be unmeasured without moving the sensor. Thereby, the analysis of the magnetic field over a wide area, which includes not only the strength of the magnetic field, but also the directions of magnetic force lines, can be carried out in a very short time.

(Experiment)

Figure 10:
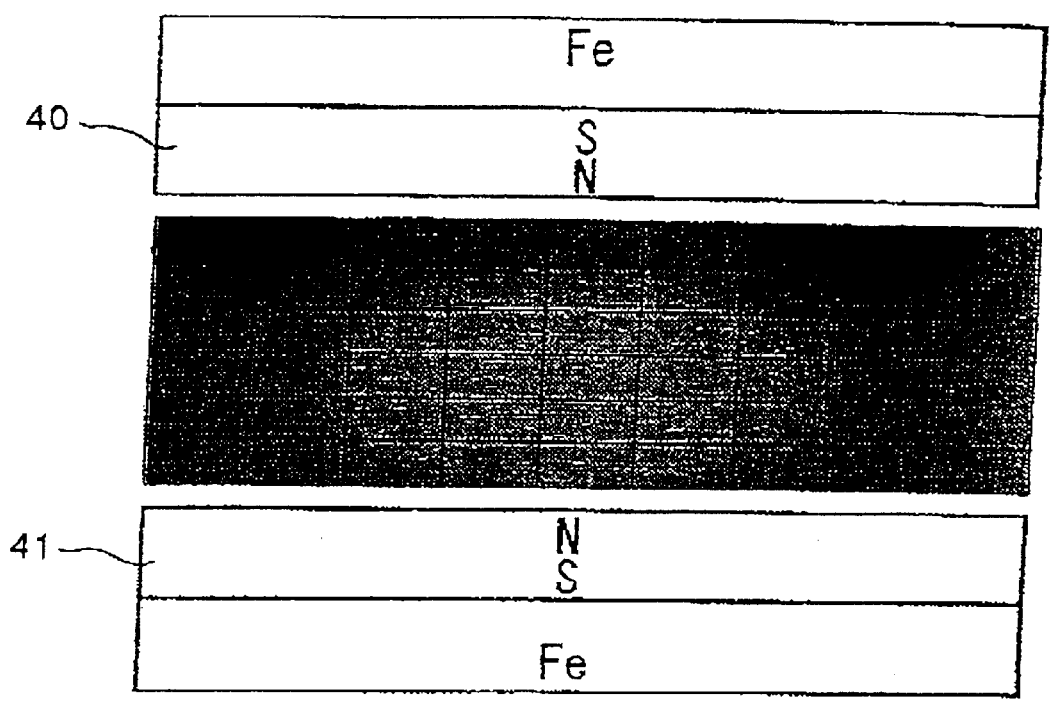
FIG. 10 is a view showing a measurement result of the strength of the magnetic field using the plane magnetic sensor of an experiment.

As shown in FIG. 10, a magnetic field between two permanent magnets 40 and 41 which are spaced from each other and disposed with the same polarities thereof opposite to each other is measured vertically. The plane magnetic sensor is the same as that shown in FIG. 1. A Fe—$SiO_2$ film having a thickness of 8000 Å is used as the sensing layer 11, and copper (Cu) having a thickness of 2000 Å is used as the conductor layers 12, 13 which are laminated thereto.

Its result is processed by a computer which processes and displays the strength of the magnetic field by the gradation of a color, as shown in FIG. 10. The darkest part in the drawing is a part where the magnetic field is the strongest, and the color is lightened as the magnetic field weakens. Thus, the strength of the magnetic field can be measured without fail by using the plane magnetic sensor 10.

When the plane magnetic sensor 10 is once disposed vertically between the permanent magnets 40, 41, it is not necessary to move it at all. The computer as the controlling means can change from one measuring point to another by simply switching to change the combinations of the line conductor films 12a and 13a to which the driving voltage is applied. Therefore, the measurement can be carried out in a very short time, compared with the case in which a conventional sensor which is made of a hole element and the like moves to measure the area.

The plane magnetic sensor and the plane magnetic sensor for the multidimensional magnetic field analysis include the sensing layer which is made of magnetoresistance effect film formed in a planar state with an arbitrary size, and the conductor layers which are laminated on the respective surfaces of the magnetoresistance effect film, and the line conductor films of one conductor layer and the line conductor films of the other conductor layer are arranged to intersect to each other in the plan view, with the magnetoresistance effect film therebetween. The sensing layer passes the current therethrough due to the tunneling effect only when the voltage reaches or exceeds the predetermined value, and changes its resistance value to show the giant magnetoresistance effect when the directions of magnetization of the magnetic particles change according to the strength of the magnetic field. The conductor layers are made of the plurality of the line conductor films which are in the linear shapes alone the directions of the respective surfaces with the predetermined intervals therebetween, Thus, the characteristics of the magnetic fields in the plural points can be measured in a very short time and magnetic field changes of the periphery of an object to be measured can be detected in real time. Further, since the conductor layers are made of the line conductor films, it is suitable for the practical use because of the small number of the lead wires.

While preferred embodiments of the invention have been described with a certain degree of particularity with reference to the drawings, obvious modifications and variations are possible in light of the above teachings. The scope of the invention is to be determined from the claims appended thereto.

What is claimed is:

1. A plane magnetic sensor for a multidimensional magnetic field analysis, comprising:

a plane magnetic sensor comprising a sensing layer composed of an arbitrary-sized plane magnetoresistance effect film, to pass a current therethrough due to a tunneling effect only when voltage reaches or exceeds a predetermined value, and to change its resistance value to show a giant magnetoresistance effect when directions of magnetization of magnetic particles change according to the strength of a magnetic field, and conductor layers which are laminated on respective surfaces of the magnetoresistance effect film and are composed of a plurality of line conductor films formed in linear shapes along directions of the respective surfaces with predetermined intervals therebetween, wherein the line conductor films of one conductor layer and the line conductor films of the other conductor layer are arranged to intersect to each other in plan view, with the magnetoresistance effect film therebetween; and at least one other plane magnetic sensor including a sensing layer which is composed of an arbitrary-sized plane magnetoresistance effect film having a magnetic anisotropy, and conductor layers which are laminated on the respective surfaces of the sensing layer and are formed by a plurality of line conductor films formed in linear shapes along directions of the respective surfaces with predetermined intervals therebetween, with the line conductor films of one conductor layer and the line conductor films of the other conductor layer being arranged to intersect to each other in plan view with the magnetoresistance effect film therebetween, wherein the plane magnetic sensors are laminated via an insulation member so that a magnetoresistance change can be detected multidirectionally.

2. The plane magnetic sensor for the multidimensional magnetic field analysis according to claim 1, wherein adjacent films of the line conductor films to compose said conductor layers are not connected to each other but are arranged independently.

3. The plane magnetic sensor for the multidimensional magnetic field analysis according to claim 1, wherein the magnetoresistance effect film to compose said sensing layer is a granular film made from an insulating oxide containing metal fine particles of magnetic material.

4. A plane magnetic sensor, comprising:

a plurality of sensing layers composed of arbitrary-sized plane magnetoresistance effect films, to pass a current therethrough due to a tunneling effect only when voltage reaches or exceeds a predetermined value, and to change its resistance value to show a giant magnetoresistance effect when directions of magnetization of magnetic particles change according to the strength of a magnetic field; and a plurality of conductor layers which are laminated between magnetoresistance effect films to compose said sensing layers and on outer surfaces of the magnetoresistance effect films to compose said sensing layers arranged outside, and are composed of a plurality of line conductor films formed in linear shapes along directions of respective surfaces with predetermined intervals therebetween, wherein the line conductor films to compose said conductor layers are arranged to intersect to each other in plan view, with the magnetoresistance effect film therebetween.

5. The plane magnetic sensor according to claim 4, wherein adjacent films of the line conductor films to compose a pair of said conductor layers arranged outside are not connected to each other but are arranged independently, and adjacent films of the line conductor films to compose a pair of said conductor layers arranged inside are connected to each other and are arranged integrally, and intersections of the line conductor films to compose the pair of said conductor layers arranged outside and intersections of the line conductor films to compose the pair of said conductor layers arranged inside are formed to almost correspond to each other when viewed in plan.

6. The plane magnetic sensor according to claim 4, wherein neither adjacent films of the line conductor films to compose a pair of said conductor layers arranged outside nor adjacent films of the line conductor films to compose a pair of said conductor layers arranged inside are connected to each other but are arranged independently, and intersections of the line conductor films to compose the pair of said conductor layers arranged outside and intersections of the line conductor films to compose the pair of said conductor layers arranged inside are formed to almost correspond to each other when viewed in plan.

7. The plane magnetic sensor according to claim 4, wherein the pair of said conductor layers arranged outside are connected to a driving circuit for supplying driving voltage or a driving current, and the pair of said conductor layers arranged inside are connected to a detecting circuit for detecting output voltage or an output current.

8. The plane magnetic sensor according to claim 4, wherein the magnetoresistance effect film to compose said sensing layer is a granular film made from an insulating oxide containing metal fine particles as magnetic material.

9. A plane magnetic sensor for a multidimensional magnetic field analysis, comprising:

a plane magnetic sensor comprising a plurality of sensing layers composed of arbitrary-sized plane magnetoresistance effect films, to pass a current therethrough due to a tunneling effect only when voltage reaches or exceeds a predetermined value, and to change its resistance value to show a giant magnetoresistance effect when directions of magnetization of magnetic particles change according to the strength of a magnetic field, and a plurality of conductor layers which are laminated between magnetoresistance effect films to compose said sensing layers and on outer surfaces of the magnetoresistance effect films to compose said sensing layers arranged outside, and are composed of a plurality of line conductor films formed in linear shapes along directions of respective surfaces with predetermined intervals therebetween, wherein the line conductor films to compose said conductor layers are arranged to intersect to each other in plan view, with the magnetoresistance effect film therebetween; and at least one other plane magnetic sensor including a sensing layer which is composed of an arbitrary-sized plane magnetoresistance effect film having a magnetic anisotropy, and conductor layers which are laminated on the respective surfaces of the sensing layer and are formed by a plurality of line conductor films formed in linear shapes along directions of the respective surfaces with predetermined intervals therebetween, with the line conductor films of one conductor layer and the line conductor films of the other conductor layer being arranged to intersect to each other in plan view with the magnetoresistance effect film therebetween, wherein the plane magnetic sensors are laminated via an insulation member so that a magnetoresistance change can be detected multidirectionally.

* * * * *